United States Patent
Diba

[19]

[11] Patent Number: 5,563,527
[45] Date of Patent: Oct. 8, 1996

[54] POWER-MANAGED SENSE AMPLIFIER FOR PROGRAMMABLE LOGIC DEVICE

[75] Inventor: Sholeh Diba, Los Gatos, Calif.

[73] Assignee: Xilinx, Inc., San Jose, Calif.

[21] Appl. No.: 426,305

[22] Filed: Apr. 21, 1995

[51] Int. Cl.$^6$ .................................................. H03K 17/16
[52] U.S. Cl. .................... 326/38; 326/9; 326/41; 327/51
[58] Field of Search ...................... 326/9, 38–39, 326/41; 327/51, 57, 541, 543

[56] References Cited

U.S. PATENT DOCUMENTS 5,247,213  9/1993  Trinh et al. ........................ 327/541 X
5,345,112  9/1994  Nazarian et al. ........................ 326/39
5,448,156  9/1995  Tsay ................................. 327/541 X

*Primary Examiner*—David R. Hudspeth
*Attorney, Agent, or Firm*—Michael A. Glenn; Norman R. Klivans; Jeanette S. Harms

[57] ABSTRACT

The present invention provides a configurable sense amplifier for a programmable logic device (PLD) that can be turned on or off as needed. Specifically, a latch stores an enable or disable state which respectively connects or disconnects the sense amplifier to a voltage source Vcc. In this manner, the sense amplifier remains on or off until the latch is reset. In one embodiment of the present invention, a reset circuit provides a predetermined value to the latch and a pass transistor to prevent floating during a power-on operation.

9 Claims, 3 Drawing Sheets

5,563,527

POWER-MANAGED SENSE AMPLIFIER FOR PROGRAMMABLE LOGIC DEVICE

BACKGROUND OF THE INVENTION

1. Field of the Invention

The present invention relates to a programmable logic device, and more particularly to a latching sense amplifier for a programmable logic device.

2. Description of the Related Art

Referring to FIG. 1, programmable logic devices (PLDs) typically use one or more interconnect arrays 10 that are programmed via a plurality of memory cells 12 (e.g. EPROM, EEPROM, flash EPROM, or flash EEPROM cells) to make various interconnections within the PLD that are specific to a desired design. In interconnect array 10, the control gate of a memory cell 12 is connected to a wordline 14, the drain of the cell is connected to a bitline 16, and the source of the cell is connected to ground or virtual ground.

An erased memory cell (i.e. a cell having a low threshold voltage Vt) becomes conductive if a high voltage Vcc is provided on its control gate, thereby effectively creating a connection in the array. In contrast, a programmed cell (i.e. a cell with a threshold voltage Vt above Vcc) does not become conductive if a high voltage is provided on its control gate. Thus, a programmed cell is not capable of affecting the state of bitline 16, and does not constitute an array connection.

Typically, a sense amplifier 18 is used on each bitline 16 of array 10 to sense and amplify the change of voltage on bitline 16, which may only vary by tens of millivolts, thereby achieving full logic levels at the array output line PT. Because sense amplifiers are typically in speed critical paths, sense amplifiers having very small switching delays are desirable. FIG. 2 illustrates one embodiment of sense amplifier 18.

Sense amplifier 18 is powered up or enabled by applying a logic 0 signal to line ENA, thereby turning off N-channel transistor 22, and a logic 1 signal to line ENA. Thus, the voltage level on a feedback line FB is established by a weak pull-up N-channel transistor 20 which is turned on by the logic 1 signal provided on line ENA and a strong pull-down N-channel transistor 21 which is controlled by the signal on bitline 16. The voltage provided to feedback line FB controls the state of N-channel transistor 24, which operates in its linear range.

A weak P-channel transistor 26 and the strong N-channel transistor 24 provides a low trigger point at a bitline voltage on the order of 0.75 volts. If the voltage on bitline 16 transitions high, transistor 21 turns more on, thereby pulling the voltage on feedback line FB lower. This lower voltage in turn causes transistor 24 to turn more off, thereby pulling up the voltage on bitline 16 less and assisting the next movement on bitline 16 (i.e. the voltage going low). Conversely, if the voltage on bitline 16 transitions low, the voltage on feedback line FB is higher. This higher voltage in turn causes transistor 24 to turn more on, thereby pulling bitline 16 to a higher voltage (via transistor 26 which serves as a current source, and operates in saturation mode).

Thus, the voltage on line ABL is controlled by transistor 24 in conjunction with bitline 16. In response to the signal on bitline 16, ratioed inverters 27 and 28 ensure that the output voltage provided on output line PT is at CMOS levels. Table 1 shows one example of logic 0 and logic 1 voltage values on the lines 16, FB, ABL, NBL, and PT.

TABLE I

| Signal | Logic 1 | Logic 0 | Difference |
|---|---|---|---|
| 16 | 0.769 v | 0.746 v | 0.023 v |
| FB | 1.77–1.88 v | N/A | N/A |
| ABL | 2.76 v | 2.18 v | 0.58 v |
| NBL | 0.491 v | 3.33 v | 2.84 v |
| PT | 4.4 v | 0 v | 4.4 v |

Table 1 shows that a small swing in the voltage on bitline 16 can produce a switch in the CMOS signal on output line PT.

Depending upon the state of EPROM 12 as controlled by word line 14, the voltage on bitline 16 is pulled lower or higher to indicate a logic 0 or logic 1 signal. If the signal on word line 14 is a logic 1 and assuming that EPROM 12 is erased, then the voltage on bitline 16 is pulled lower to indicate a logic 0 signal. When biased on, EPROM 12 pulls the voltage on bitline 16 toward virtual ground VG. As shown in FIG. 2, virtual ground VG is separated from actual ground by transistor 25, which is controlled by a signal on line ABL.

Sense amplifier 18, however, burns power constantly, irrespective of the voltage on bitline 16. Specifically, transistor 24 is always at least minimally on, thereby providing a current branch through conducting transistor 26, transistor 24, and transistor 23 (or additionally transistor 25 if EPROM 12 is on). Note that because of the analog signal levels provided on lines ABL and NBL, the transistors (not shown) which form inverters 27 and 28 also form current paths.

Thus, prior art sense amplifier 18 typically draws substantial amounts of DC current in both the bitline high and bitline low states, in addition to the large AC switching current generated during a transition in bitline state. Specifically, each sense amplifier typically burns approximately 200 to 600 microamps. Therefore, a PLD having 2000 sense amplifiers burns 400 milliamps to 1.2 amps. In fact, sense amplifiers are generally responsible for drawing the majority of the DC current in a PLD. This large current draw is highly undesirable.

Therefore, a need arises for a sense amplifier configuration that completely shuts off the unused sense amplifiers, thereby reducing the overall DC current drawn by the PLD.

SUMMARY OF THE INVENTION

The present invention provides a configurable sense amplifier for a programmable logic device (PLD) that can be turned on or off as needed. Specifically, a latch stores an enable or disable state which respectively connects or disconnects the sense amplifier to a voltage source Vcc. In this manner, the sense amplifier remains on or off until the latch is reset. In one embodiment of the present invention, a reset circuit provides a predetermined value to the latch and a pass transistor to prevent floating during a power-on operation.

DETAILED DESCRIPTION OF THE DRAWINGS

Figure 1:
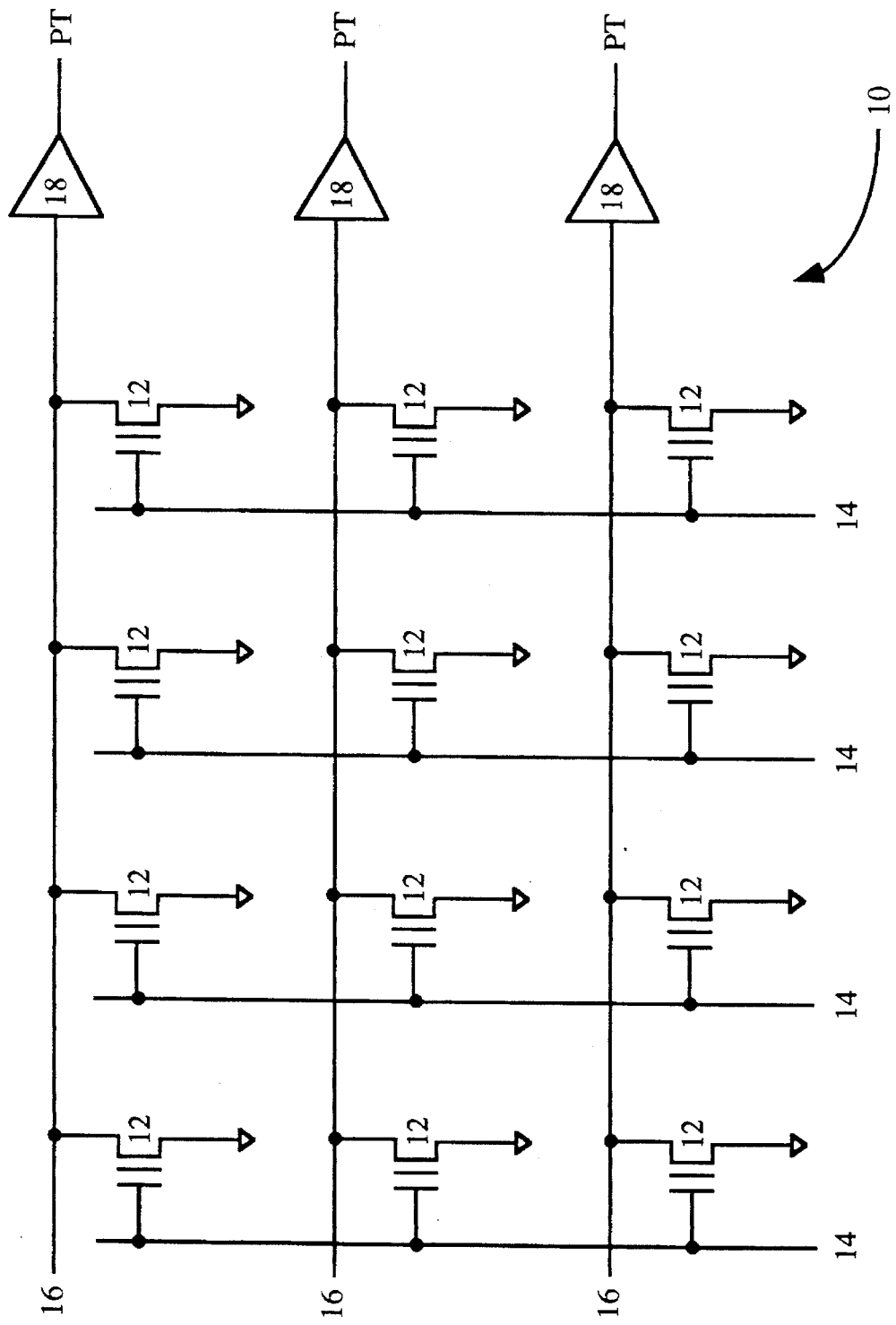
FIG. 1 is a block schematic diagram of a typical programmable logic device.
Figure 2:
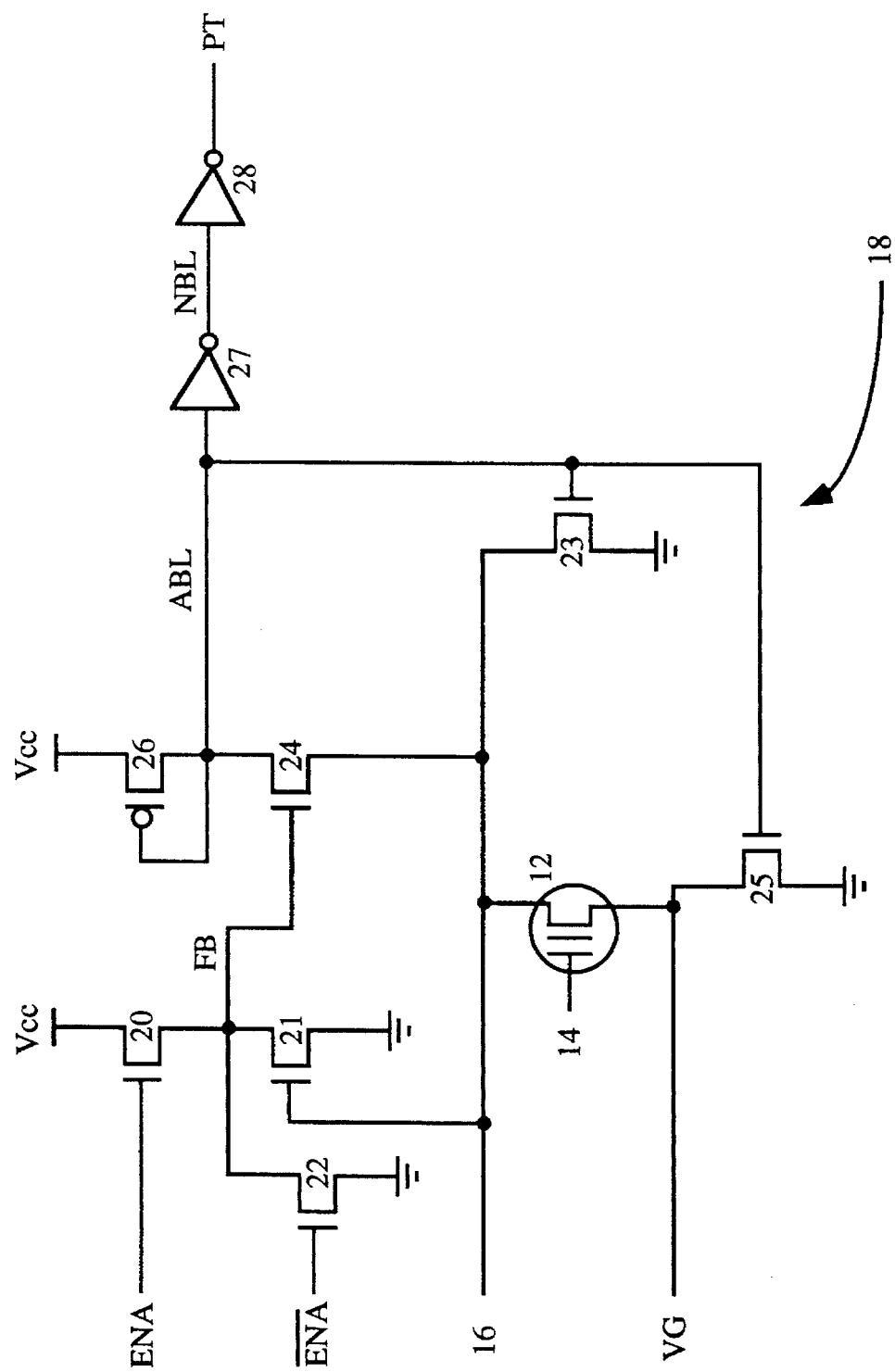
FIG. 2 is a schematic diagram of a prior art sense amplifier.
Figure 3:
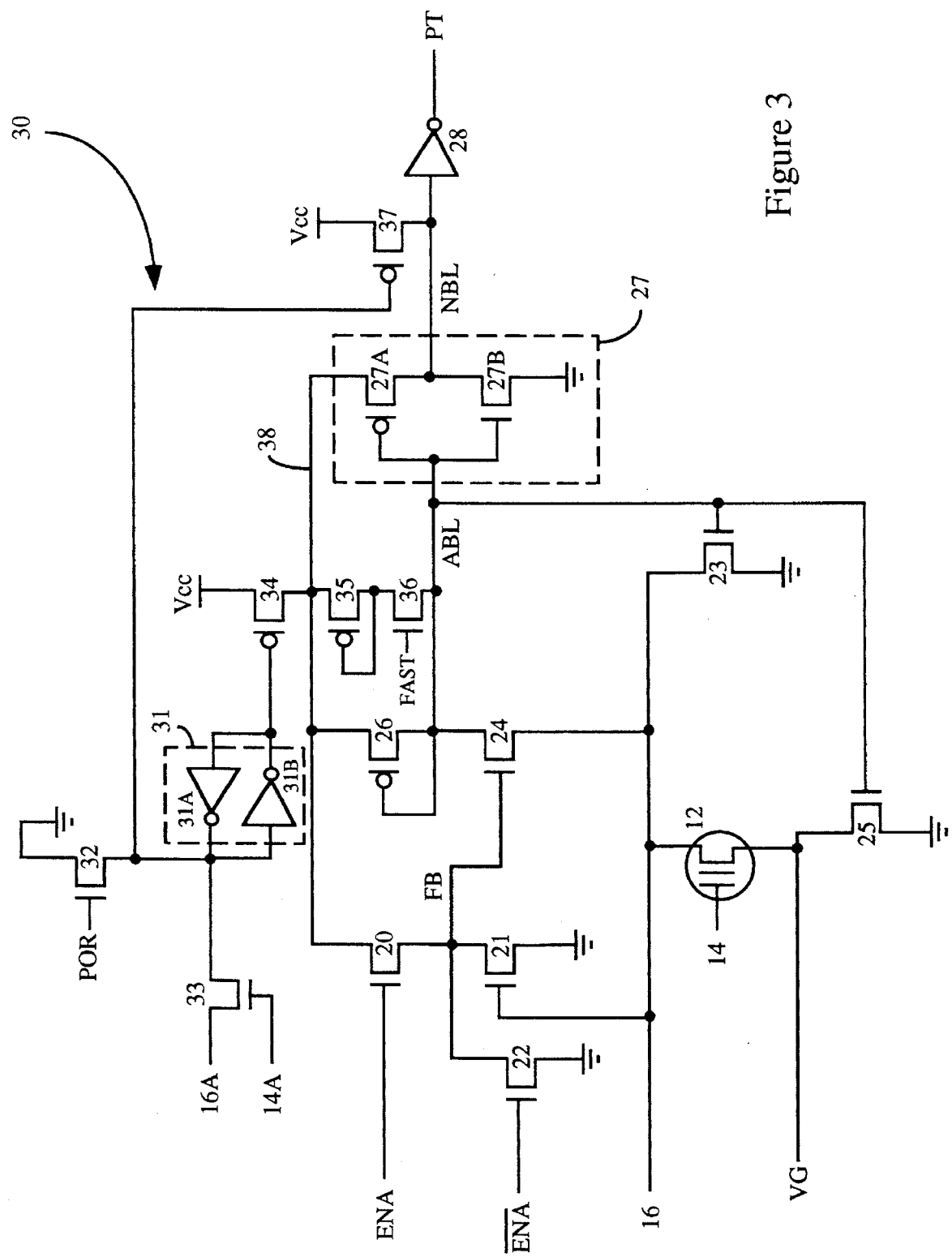
FIG. 3 is a schematic diagram of a power-managed sense amplifier in accordance with the present invention.

FIG. 3 illustrates a power-managed sense amplifier 30 in accordance with the present invention which includes a latch 31 for storing an enabling/disabling signal. Latch 31 includes two cross-coupled inverters 31A and 31B. Latch 42 is set and reset by a pass transistor 33 which is responsive to logic signals provided by a wordline 14A and a bitline 16A. Specifically, a high signal on wordline 14A turns on transistor 33, thereby allowing transfer of the logic signal on bitline 16A. That transferred signal is inverted by inverter 31B and then provided to the gate of a pass transistor 34. The inverted signal is reinverted by inverter 31A, thereby latching the signal into latch 31.

Latch 31 provides either an enabling signal or a disabling signal to a pass transistor 34. In this embodiment of the invention, pass transistor 34 is a p-channel device. Therefore, if latch 31 provides a logic zero signal, i.e. enabling signal, to pass transistor 34, that transistor conducts and passes a high voltage from a voltage source Vcc to line 38. In this manner, line 38 supplies the sole voltage source for sense amplifier 30, with the exception of the voltage source for inverter 28 which is explained in detail in reference to the power-on-reset signal POR.

On the other hand, if latch 31 provides a logic one signal, i.e. disabing signal, to pass transistor 34, that transistor is non-conductive, thereby ensuring that sense amplifier has no voltage source, i.e. effectively turning off sense amplifier 30. Because the enable/disable signal is stored by latch 31, sense amplifier 30 is maintained in a desired state until latch 31 is reset via wordline 14 and bitline 16 or until the PLD is powered down and then repowered (described in detail below). In one embodiment, high signals are provided to all wordlines 14A, and all bitlines 16A provide low signals transferred from a plurality of memory cells, thereby initially disabling all the sense amplifiers in the PLD. Thereafter, the user turns on a particular sense amplifiers by storing a high signal in the appropriate memory cell and turning on transistor 33.

Sense amplifier 30 is set in two different ways via wordline 14a and bitline 16a. In one method, latch 31 is loaded during the power-up operation of the device, thereby eliminating any delay involved in the speed path (i.e. sense amplifier 30 is already stablized to an ON or OFF condition). In another method, latch 31 is set via transistor 33 by coupling wordline 14 to wordline 14A, and bitline 16A to a voltage source Vcc. Note that this method is best used in applications in which sense amplifier 30 is not in a critical signal path, i.e. associated with a slower signal path. In other words, in that embodiment, the user has determined that the short delay during which sense amplifier 30 stabilizes as the voltage on wordline 14 is switching is acceptable. Because sense amplifier 30 is controlled by the wordlines and the bitlines that are typically present in the PLD, additional control lines and associated circuitry are not required in this embodiment, thereby conserving valuable silicon area.

In this embodiment of the present invention, a high power-on reset signal (POR) is provided to sense amplifier 30 when power is first applied to the PLD (or after a power down operation), thereby turning on transistor 32 and setting latch 31 to a known value (i.e. providing a high signal to the gate of transistor 34). In this manner, as previously described, sense amplifier 30 is disabled. After power-up, wordlines 14A are sequentially selected, such that all bitlines 16A associated with a particular wordline 14A provide a signal that is used to reset its associated latch 31. In other embodiments, each sense amplifier 30 is assigned a default state, wherein conditions for switching from the default state to another predefined state are tailored to the particular requirements of the PLD.

If sense amplifier 30 is disabled, it is desirable to minimize the possibility of an ambiguous state, typically referred to as "floating", at the sense amplifier output line 31. Accordingly, sense amplifier 30 also includes a p-channel transistor 37. During the previously described power-up mode, a low signal is provided to the gate of transistor 37, thereby turning on that transistor and transferring a high voltage to line NBL. Inverter 28 inverts that high signal and provides a low signal on product line PL. In this manner, the present invention prevents the potential floating state of sense amplifier 30 during a power up operation.

In one embodiment of the present invention, transistors 35 and 36 assist in a low-to-high signal transistion on amplified bit line ABL. Specifically, if sense amplifier is enabled (by any method described above), then a high FAST signal to transistor 36 turns on that transistor. Because the drain of transistor 35 is connected to its gate, this transistor is briefly on, thereby transferring a high signal pulse on line ABL.

A PLD with sense amplifier control as provided in the present invention (i.e. including a plurality of sense amplifiers 30) provides power saving that directly correlate to the percentage of sense amplifiers which are turned off in the PLD. As mentioned previously, a typical sense amplifier burns approximately 200 to 600 microamps. Therefore, a prior art PLD having 2000 sense amplifiers burns 400 milliamps to 1.2 amps. If 50% of those sense amplifiers are not used, which is not uncommon, the PLD having the sense amplifier control of the present invention (i.e. including a plurality of sense amplifiers 30) reduces power consumption to an acceptable level of 200 milliamps to 600 microamps. Thus, the present invention in a typical application saves 50% power consumption compared to the prior art.

Although the invention is described herein with reference to the embodiment shown in FIG. 3, one skilled in the art will readily appreciate that other devices/circuits may be substituted for those set forth herein without departing from the spirit and scope of the present invention. For example, in another embodiment, the power-on reset signal POR is programmed to turn on the sense amplifiers in a predetermined order upon initialization of the PLD. In other embodiments, latch 31 is implemented, for example, as two or more transistors, or as a non-volatile memory cell. Accordingly, the invention should only be limited by the claims included below.

I claim:

1. A sense amplifier for a programmable logic device, comprising:

a latch adapted to toggle between a first logic state and a second logic state in response to a control signal; and a first pass device in communication with said latch and adapted to connect a voltage source to said sense amplifier in response to said first logic state, thereby enabling said sense amplifier, and adapted to prevent connection of said voltage source from said sense amplifier in response to said second logic state, thereby disabling said sense amplifier;

wherein said latch is reset in response to a wordline signal and a bitline signal.

2. The sense amplifier of claim 1 wherein said latch is reset in response to a pre-programmed signal.

3. The sense amplifier of claim 1 wherein application of a power-on reset signal to said latch restores said sense amplifier to a default state.

4. The sense amplifier of claim 1 further comprising:

a second pass device adapted to source a predetermined current to a sense amplifier output if said sense amplifier is disabled.

5. The sense amplifier of claim 1 wherein said latch comprises a pair of cross-coupled inverters.

6. The sense amplifier of claim 1 wherein said latch is a non-volatile storage device.

7. A method for operating a sense amplifier for a programmable logic device, comprising the steps of:

toggling a latch between a first logic state and a second logic state in response to a control signal, wherein said latch toggles in response to a bitline signal and a wordline signal; and connecting a voltage source to said sense amplifier in response to said first logic state, thereby turning on said sense amplifier on, and preventing a connection of said voltage source to said sense amplifier in response to said second logic state, thereby turning off said sense amplifier.

8. A sense amplifier for a programmable logic device, comprising:

a latch adapted to toggle between a first logic state and a second logic state in response to a control signal;

a first pass device in communication with said latch and adapted to connect a voltage source to said sense amplifier in response to said first logic state, thereby enabling said sense amplifier, and adapted to prevent connection of said voltage source from said sense amplifier in response to said second logic state, thereby disabling said sense amplifier; and a second pass device adapted to source a predetermined current to a sense amplifier output if said sense amplifier is disabled.

9. A sense amplifier for a programmable logic device, comprising:

a latch that is a non-volatile storage device and adapted to toggle between a first logic state and a second logic state in response to a control signal; and a first pass device in communication with said latch and adapted to connect a voltage source to said sense amplifier in response to said first logic state, thereby enabling said amplifier, and adapted to prevent connection of said voltage source from said sense amplifier in response to said second logic state, thereby disabling said sense amplifier.

* * * * *

UNITED STATES PATENT AND TRADEMARK OFFICE
CERTIFICATE OF CORRECTION

PATENT NO. : 5,563,527
DATED : October 8, 1996
INVENTOR(S) : Sholeh Diba

It is certified that error appears in the above-identified patent and that said Letters Patent is hereby corrected as shown below:

Col. 1, line 39, "line ENA, thereby" should read --line $\overline{\text{ENA}}$, thereby--.

Signed and Sealed this

Sixth Day of January, 1998

Attest:

BRUCE LEHMAN

*Attesting Officer*  *Commissioner of Patents and Trademarks*